US008657468B2

(12) United States Patent
Im et al.

(10) Patent No.: US 8,657,468 B2
(45) Date of Patent: Feb. 25, 2014

(54) LAMP UNIT INCLUDING FLEXIBLE SUBSTRATE

(75) Inventors: Jung Hyuk Im, Gwangju (KR); Eun Sung Kim, Jeollanam-do (KR)

(73) Assignee: Ledlitek Co., Ltd., Gwangju (KR)

( * ) Notice: Subject to any disclaimer, the term of this patent is extended or adjusted under 35 U.S.C. 154(b) by 263 days.

(21) Appl. No.: 13/128,857

(22) PCT Filed: Sep. 29, 2009

(86) PCT No.: PCT/KR2009/005566
§ 371 (c)(1),
(2), (4) Date: May 23, 2011

(87) PCT Pub. No.: WO2010/058904
PCT Pub. Date: May 27, 2010

(65) Prior Publication Data

US 2011/0228536 A1 Sep. 22, 2011

(30) Foreign Application Priority Data

Nov. 18, 2008 (KR) ........................ 10-2008-0114866

(51) Int. Cl.
*F21V 21/14* (2006.01)
*H05K 1/02* (2006.01)

(52) U.S. Cl.
USPC . 362/249.04; 362/545; 362/549; 362/249.08; 174/254

(58) Field of Classification Search
USPC ............... 362/545, 523, 549, 249.01, 249.02, 362/249.04, 249.08; 174/254
See application file for complete search history.

(56) References Cited

U.S. PATENT DOCUMENTS

| | | | | |
|---|---|---|---|---|
| 3,427,715 | A * | 2/1969 | Mika | 174/254 |
| 3,892,959 | A * | 7/1975 | Pulles | 362/613 |
| 5,404,282 | A * | 4/1995 | Klinke et al. | 362/249.06 |
| 5,519,596 | A * | 5/1996 | Woolverton | 362/249.01 |
| 5,569,886 | A * | 10/1996 | Tanabe et al. | 174/254 |
| 6,299,337 | B1 * | 10/2001 | Bachl et al. | 362/545 |
| 6,880,955 | B2 * | 4/2005 | Lin | 362/237 |
| 6,936,855 | B1 * | 8/2005 | Harrah | 257/88 |
| 7,201,511 | B2 * | 4/2007 | Moriyama et al. | 362/646 |
| 7,513,664 | B2 * | 4/2009 | Chou | 362/494 |
| 2008/0101070 | A1 * | 5/2008 | Chou | 362/249 |
| 2009/0103295 | A1 * | 4/2009 | Wang | 362/234 |
| 2011/0096545 | A1 * | 4/2011 | Chang | 362/249.02 |

FOREIGN PATENT DOCUMENTS

| | | |
|---|---|---|
| JP | 2005-175137 A | 6/2005 |
| KR | 10-0493585 B1 | 6/2005 |

* cited by examiner

*Primary Examiner* — Ismael Negron
(74) *Attorney, Agent, or Firm* — Mitchell P. Brook; McKenna Long & Aldridge LLP

(57) ABSTRACT

A lamp unit includes a flexible base member, a conductive pattern layer forming a conductive pattern on the base member and maintaining a bent shape of the base member when the base member is bent, and LED lamps mounted on the conductive pattern layer and emitting light when a current is applied thereto. The lamp unit can be bent according to the shape of an object on which the lamp unit is to be installed.

4 Claims, 7 Drawing Sheets

LAMP UNIT INCLUDING FLEXIBLE SUBSTRATE

BACKGROUND OF THE INVENTION

1. Field of the Invention

The present invention relates to a lamp unit, and more particularly, to a lamp unit configured such that light emitted from a lamp is irradiated in a constant irradiation direction when the lamp unit is installed on one surface of a vehicle having a curvature.

2. Description of the Related Art

A vehicle is provided in its front and rear sides with a head lamp for securing driver's visibility in the nighttime and brake and turn signal lamps for indicating vehicular traveling state and direction to be perceived from the outside.

Since the lamp unit is closely related with safe driving of a vehicle, it is very important to enable a driver of a vehicle close to a traveling vehicle to clearly identify an illumination state.

In order to make a vehicle more esthetically pleasing and to reduce air resistance, various attempts have recently been made to make a connecting part of a lateral surface and a rear portion of a vehicle body smoothly curved. In this regard, it is necessary to fabricate the lamp unit to have a curvature corresponding to that of the vehicle body so as to be installed in the vehicle body having a curvature. In this case, light emitting diode (LED) lamps are installed in the lamp unit such that an irradiation direction of light emitted from the LED lamps is not oriented to the rear portion of the vehicle but is oriented to the later surface because of the curvature. Thus, the light emitted from all of the LED lamps is not irradiated rearward and frontward, thereby making it difficult for a driver of an adjacent vehicle to perceive that the light of the vehicle is on or off.

Accordingly, there exists a need for a lamp unit fabricated such that the light emitted from LED lamps is irradiated in a uniform irradiation direction so as to be clearly perceived by a driver of a front or rear vehicle even when the LED lamps are installed on a curved vehicle body.

SUMMARY OF THE INVENTION

The present invention provides a lamp unit configured to easily maintain a curved state so as to mount a board stepwise on which a lamp is installed in a vehicle.

The above and other objects of the present invention will be described in or be apparent from the following description of the preferred embodiments.

According to an aspect of the present invention, there is provided a lamp unit including a flexible base member, a conductive pattern layer forming a conductive pattern the base member and maintaining a bent shape of the base member when the base member is bent, and LED lamps mounted on the conductive pattern layer and emitting light by the current applied thereto.

The conductive pattern layer may include an elongate section extending along a lengthwise direction of the base member, and an enlarged section installed at a bent portion of the base member and formed to have a larger width than the elongate section so as to maintain the bent shape of the base member.

The enlarged section may include a plurality of guide grooves extending to be spaced a predetermined distance apart from each other along a direction crossing the lengthwise direction of the base member so as to allow the base member to be easily bent, the plurality of guide grooves being recessed a predetermined depth from a top surface of the enlarged section.

The conductive pattern layer may include a first section extending along a lengthwise direction of the base member, and a second section formed at the bent portion of the base member and having a greater thickness than the first section so as to maintain the bent shape of the base member.

According to another aspect of the present invention, there is provided a lamp unit including a circuit member including a flexible base plate and a conductive pattern formed at one side of the base plate, a shape fixing member installed at the circuit member and maintaining a bent shape when the circuit member is bent, and LED lamps mounted on the circuit member and emitting light by the current applied thereto through the conductive pattern.

The shape fixing member may include a metal layer coated on one selected from top and bottom surfaces of the circuit member or both of the top and bottom surfaces of the circuit member, the metal layer made of at least one selected from copper, silver, gold and aluminum, or alloys of two or more of these metals.

The shape fixing member may include a first coating layer coated on one surface selected from the top and bottom surfaces of the circuit member and a second coating layer coated on the other surface, the first coating layer may be continuously formed along the lengthwise direction of the circuit member, and the second coating layer may include a cut-away portion of a coating layer removed from the bent portion of the circuit member by a predetermined length so as to allow the circuit member to be easily bent at the bent portion.

The shape fixing member may include a first coating layer coated on one surface selected from top and bottom surfaces of the circuit member, and a second coating layer coated on the other surface, the first coating layer may be continuously formed along the lengthwise direction of the circuit member, and the second coating layer may be formed at the bent portion to increase a fixing force of the circuit member at the bent portion.

The shape fixing member may include a thin film part coated on a planar part of the circuit member, which is not bent, and a shape maintaining part coated on the bent portion of the circuit member and having a thickness greater than that of the thin film part so as to easily maintain the bent shape of the circuit member.

As described above, the lamp unit according to the present invention can be mounted in an easily modified manner according to the shape of an object on which the lamp unit is to be installed. In addition, since the lamp unit is fabricated in a simplified manner, the fabrication cost can be reduced.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Hereinafter, the lamp unit lamp unit according to embodiments of the present invention will be described in more detail.

Figure 1:
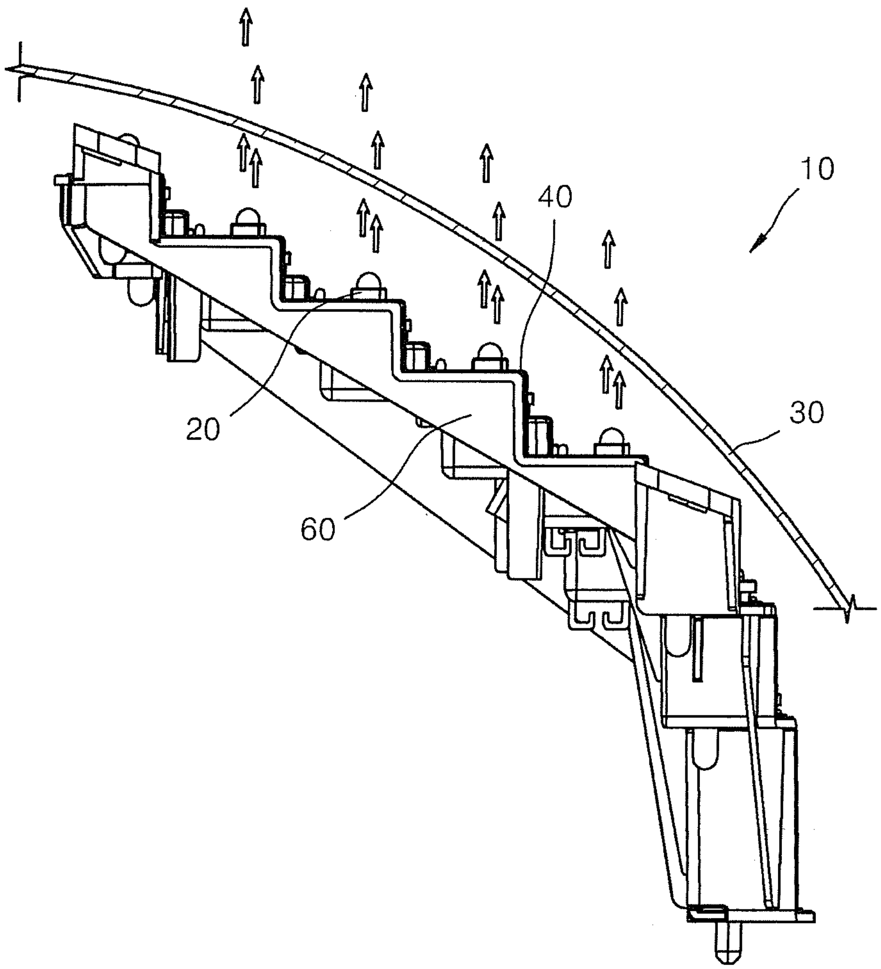
FIG. 1 is a side view illustrating a state in which a lamp unit according to the present invention is stepwise curved.

FIG. 1 is a side view illustrating a state in which a lamp unit according to the present invention is stepwise curved to fabricate a tail lamp 10 of a vehicle.

As shown in FIG. 1, a fastening portion 50 supporting the lamp unit 40 in a housing 30 is formed stepwise to allow the light emitted from LED lamps 20 to be irradiated to a rear portion of the vehicle even when the tail lamp 10 of the vehicle is fabricated to have a predetermined curvature.

Therefore, the lamp unit 40 should be bendable to be shaped corresponding to the stepped fastening portion 50. That is to say, the lamp unit 40 needs to be bendable and capable of maintaining the bent shape.

Figure 2:
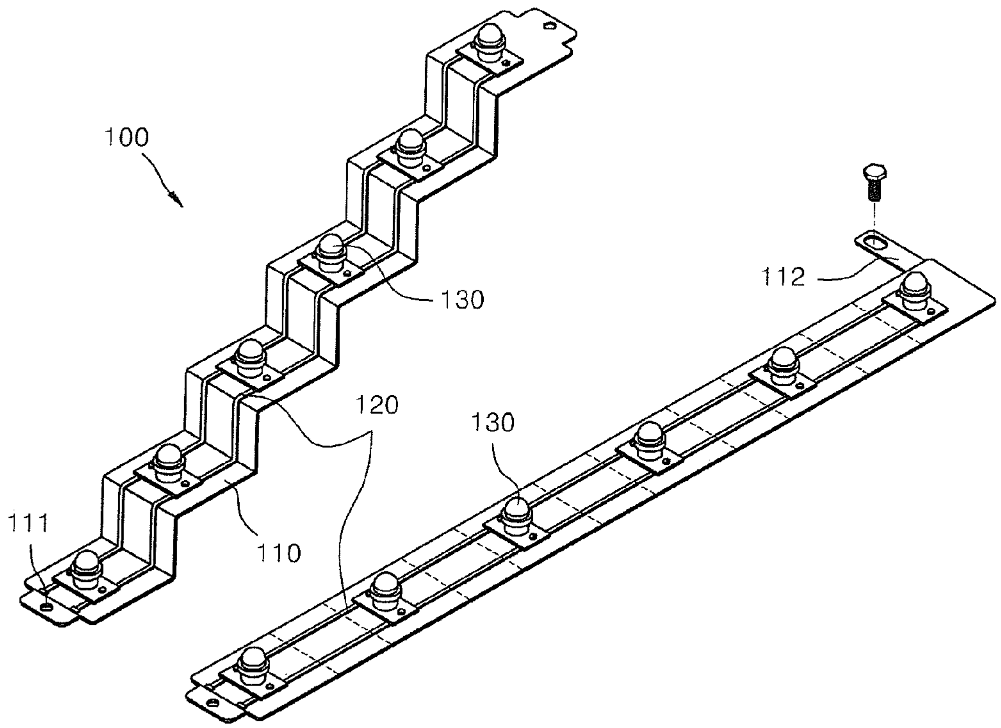
FIG. 2 is a perspective view of a lamp unit according to a first embodiment of the present invention.
Figure 3:
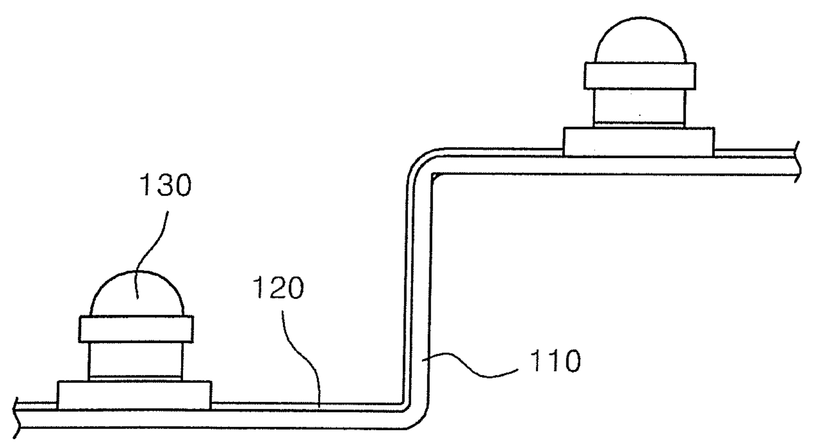
FIG. 3 is a partially cut-way side view of the lamp unit shown in FIG. 2.

FIGS. 2 and 3 illustrate a lamp unit 100 according to a first embodiment of the present invention, which is bendable and capable of maintaining its shape to be mountable on a stepped fastening portion, as shown in FIG. 1.

The lamp unit 100 includes a base member 110, a conductive pattern layer 120 formed on a top surface of a base member 110, and LED lamp 130 surface-mounted on the conductive pattern layer 120.

The base member 110 is formed of a flexible synthetic resin member. Since the base member 110 is flexible, it can be easily modified according to the shape of an object that is stepped, like the fastening portion 50, as shown in FIG. 1, or bent at a predetermined angle. The base member 110 includes a fixing portion 111 for fixing the base member 110 to the object. A connecting portion 112 for connecting a plurality of base members 110 is formed at one side of the fixing portion 111, if necessary.

The conductive pattern layer 120 is formed on the base member 110 for the purpose of applying current to the LED lamp 130.

In the illustrated embodiment, the conductive pattern layer 120 is formed of a copper foil, and maintains the base member 110 in a bent shape.

The conductive pattern layer 120 preferably has a thickness in a range of 30 to 80 μm.

If the thickness of the conductive pattern layer 120 is less than 30 μm, a force of the conductive pattern layer 120 to maintain the shape of the base member 110 is not sufficient, so that the base member 110 may not be maintained at a bent state.

As the thickness of the conductive pattern layer 120 increases, the force of the conductive pattern layer 120 to maintain the shape of the base member 110 also increases. However, if the thickness of the conductive pattern layer 120 exceeds 80 μm, the base member 110 may not be easily bent, and a spring-back phenomenon occurs due to elasticity of the conductive pattern layer 120 to make it impossible for the base member 110 to maintain its initially transformed state. Therefore, it is preferable to form the conductive pattern layer 120 to a thickness in a range of 30 μm to 80 μm.

The LED lamp 130 is surface-mounted on the conductive pattern layer 120 to then emit light using the current applied to the conductive pattern layer 120.

In the LED lamp 130 according to the illustrated embodiment, LEDs are used. However, in addition to the LEDs illustrated, a variety of types of the LED lamp 130 may also be used.

Figure 4:
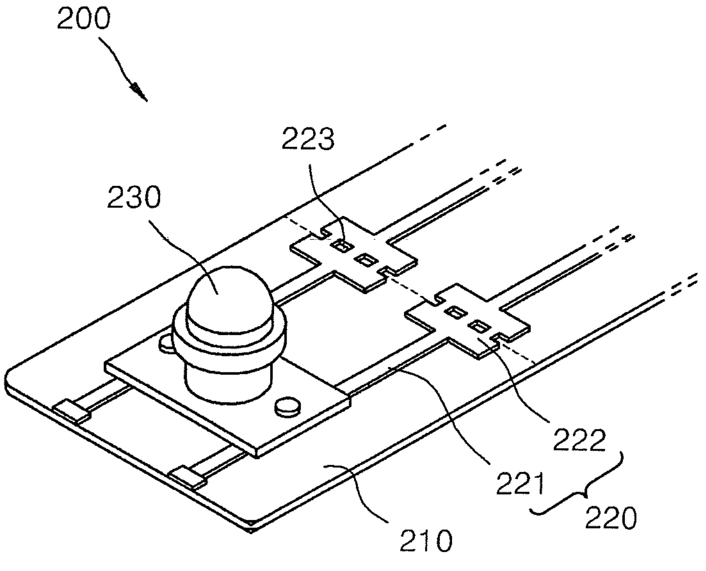
FIG. 4 is a perspective view of a lamp unit according to a second embodiment of the present invention.
Figure 5:
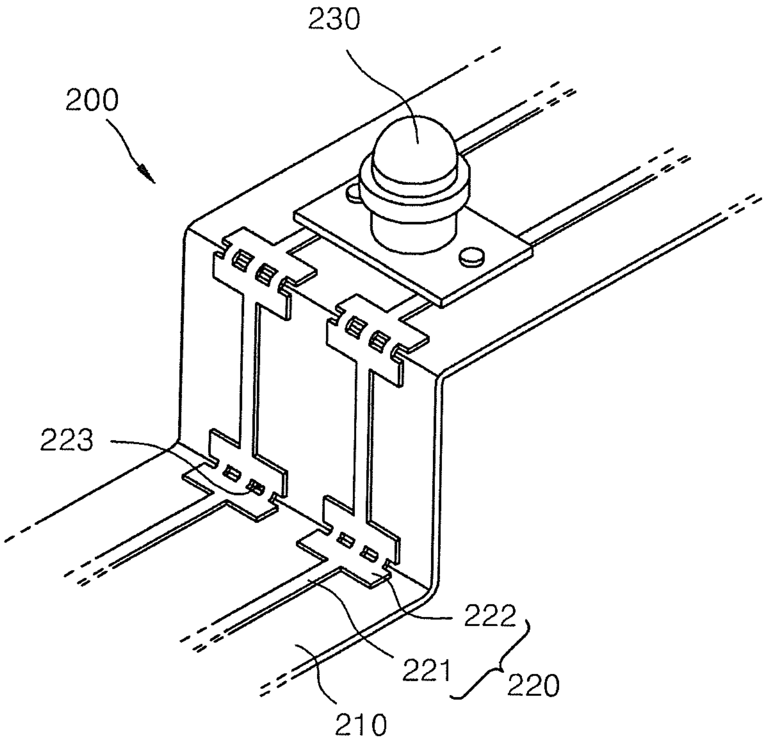
FIG. 5 is a partially cut-way side view illustrating a curved state of the lamp unit shown in FIG. 4.

FIGS. 4 and 5 illustrate a lamp unit 200 according to a second embodiment of the present invention.

The lamp unit 200 according to the embodiment of the present invention includes a base member 210, a conductive pattern layer 220 formed on the base member 210, and an LED lamp 230.

Like in the first embodiment, the base member 210 is also formed of a flexible synthetic resin member so as to be easily modified according to the shape of an object on which the lamp unit is to be installed. In addition, the LED lamp 230 is mounted on the conductive pattern layer 220 to emit light by power applied thereto.

The conductive pattern layer 220 according to the illustrated embodiment is formed such that it is applied with current to then be supplied to the LED lamp 230, and extends in two lines parallel to each other along the lengthwise direction of the base member 210.

The conductive pattern layer 220 includes an elongate section 221 extending on a plane when the base member 210 is bent, and an enlarged section 222 installed at a bent portion.

The elongate section 221 is formed of a copper foil so as to be electrically conducted and to offer a fixing force of the base member 210 to be maintained on a plane.

As described above, the enlarged section 222 is formed at a bent portion of the base member 210, and is wider than the elongate section 221 so as to maintain a bent shape of the base member 210 when the base member 210 is bent.

Here, a larger force is required to fix the base member 210 in a bent state than in a planar state. Thus, the enlarged section 222 formed at the bent portion is formed to be wider than the elongate section 221, thereby obtaining a sufficient fixing force using the copper foil layer.

The enlarged section 222 includes guide grooves 223.

The guide grooves 223 are arranged to be spaced a predetermined distance apart from each other along a direction orthogonal to the lengthwise direction of the base member 210, and the enlarged section 222 is downwardly recessed a predetermined depth from a top surface.

The base member 210 can be easily bent at a portion where guide grooves 223 are formed. Thus, the base member 210 can be advantageously bent at an accurate position by forming the guide grooves 223 to be disposed along the bent portion without using a separate jig.

The guide grooves 223 may be formed in various numbers and shapes in addition to those illustrated in the embodiment.

In addition, the conductive pattern layer 220 of the illustrated embodiment may be formed of a conductive metal, such as gold, silver or aluminum, or alloys thereof.

Figure 6:
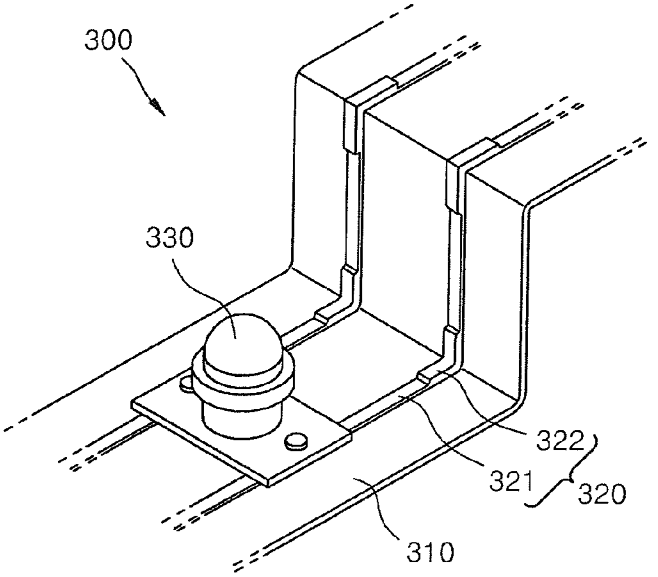
FIG. 6 is a perspective view of a lamp unit according to a third embodiment of the present invention.

FIG. 6 illustrates a lamp unit 300 according to a third embodiment of the present invention.

The lamp unit 300 according to the embodiment of the present invention also includes a flexible base member 310, a conductive pattern layer 320, and an LED lamp 330. Since the base member 310 and the LED lamp 330 are substantially the same as those of the first embodiment in view of configuration and function, detailed descriptions thereof will be omitted.

The conductive pattern layer 320 extends along the lengthwise direction of the base member 310 in two lines. The conductive pattern layer 320 includes a first section 321 formed along its elongate portions of the base member 310 extending on a planar surface, and a second section 322 formed at a bent portion of the base member 310.

The second section 322 has a larger thickness than the first section 321 to offer a force of fixing the base member 310 at a bent state.

That is to say, the second section 322 formed at the bent portion, which requires a relatively large fixing force, is formed more thickly than the planar portion of the base member 310, and the first section 321 is formed more thinly than the planar portion of the base member 310, thereby minimizing an amount of raw material used to form the conductive pattern layer 320, and ultimately reducing the fabrication cost.

Figure 7:
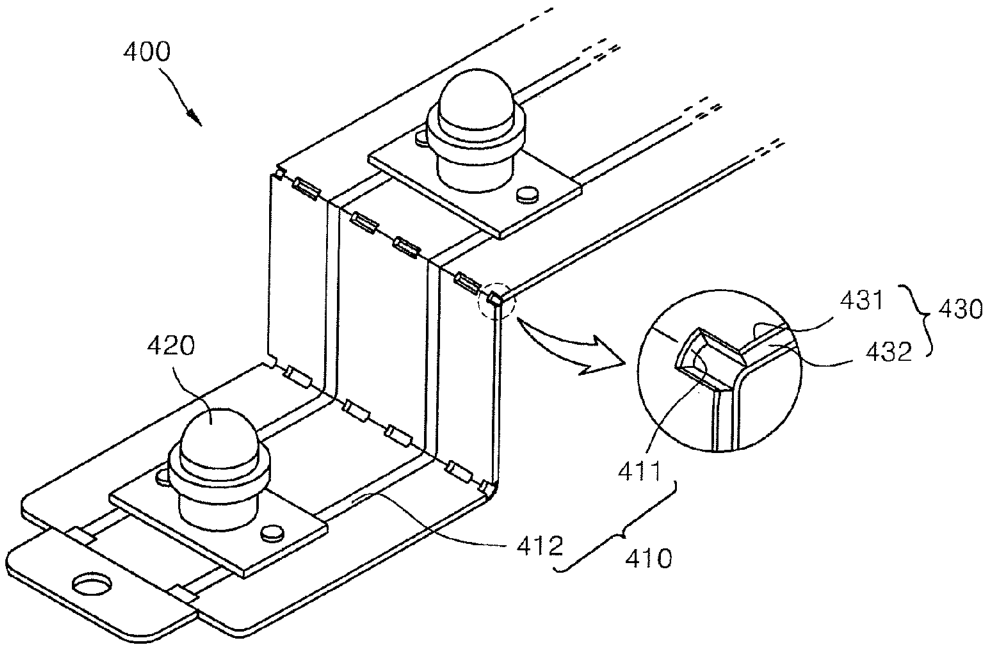
FIG. 7 is a perspective view of a lamp unit according to a fourth embodiment of the present invention.

FIG. 7 illustrates a lamp unit 400 according to a fourth embodiment of the present invention.

Referring to FIG. 7, the lamp unit 400 according to the fourth embodiment of the present invention includes a circuit member 410, a shape fixing member 430 fixing the circuit member 410 in a bent state, and an LED lamp 420.

The circuit member 410 includes a base plate 411 and a conductive pattern 412 formed on a top surface of the base plate 411. The base plate 411 is formed of a flexible synthetic resin member so as to be easily bent when necessary. The conductive pattern 412 is printed to form a predetermined pattern on the base plate 411 to apply current to the base plate 411.

The LED lamp 420 is installed on the base plate 411 to allow current to be applied through the conductive pattern 412.

The shape fixing member 430 is used to maintain the bent shape of the circuit member 410 when the circuit member 410 is bent according to the necessity.

The shape fixing member 430 according to the illustrated embodiment includes a first coating layer 431 and a second coating layer 432 formed on top and bottom surfaces of the circuit member 410, respectively. The shape fixing member 430 is formed by coating copper to a thickness of 30 to 80 μm. As described above with regard to the conductive pattern layer 120 of the first embodiment, if the thickness of the shape fixing member 430 is less than 30 μm, it is difficult to maintain the bent shape of the circuit member 410. If the thickness of the shape fixing member 430 is greater than 80 μm, it is not easy to bend the circuit member 410. In addition, the bent shape of the circuit member 410 cannot be maintained due to elasticity of the shape fixing member 430*n* and a spring-back phenomenon occurs. Accordingly, the thickness of the shape fixing member 430 is preferably in a range of 30 μm to 80 μm.

Since the second coating layer 432 is coated on the entire bottom surface of the circuit member 410, the bent shape of the circuit member 410 can be maintained by the second coating layer 432 when the circuit member 410 is bent due to an external force.

The first coating layer 431 includes a cut-away portion of a coating layer in a predetermined area so as to allow the circuit member 410 to be easily bent at the bent portion.

The cut-away portion includes a cut-away section and a connecting section alternately formed. Specifically, the cut-away portion is removed from a coating layer at the bent portion of the circuit member 410 by a predetermined length so as to allow the circuit member 410 to be easily bent at the bent portion, and the connecting section connects opposite parts of the first coating layer 431 at the bent portion. Since the first coating layer 431 includes the cut-away section, the bending of the circuit member 410 can be easily achieved. Thus, the circuit member 410 can be advantageously bent at an accurate position without using a separate marker or jig for marking the bent portion.

In the illustrated embodiment, the first and second coating layers 431 and 432 as the shape fixing member 430 are coated on both of top and bottom surfaces of the circuit member 410. However, the shape fixing member 430 may also be formed on only one surface selected from the top and bottom surfaces of the circuit member 410 as long as it is capable offering a sufficient fixing force for maintaining a fixed state of the circuit member 410.

Figure 8:
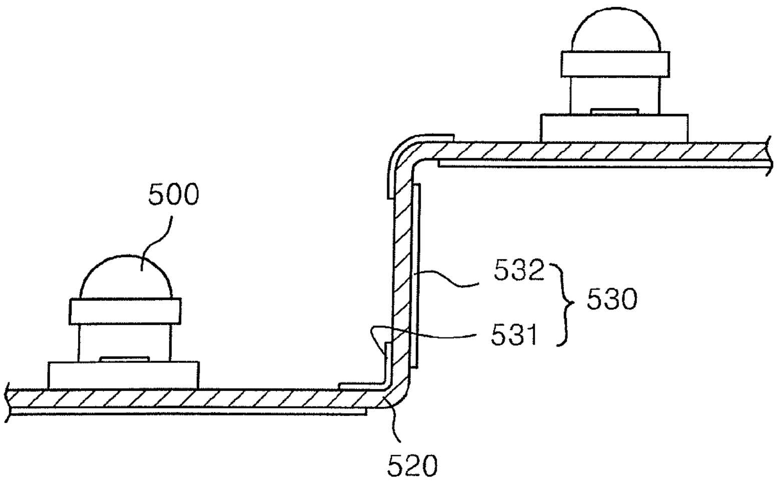
FIG. 8 is a perspective view of a lamp unit according to a fifth embodiment of the present invention.

FIG. 8 illustrates a lamp unit 500 according to a fifth embodiment of the present invention. The lamp unit 500 according to the fifth embodiment of the present invention includes a circuit member 510, a shape fixing member 530, and an LED lamp 520. The circuit member 510 and the LED lamp 520 correspond to those of the fourth embodiment.

The shape fixing member 530 according to the illustrated embodiment includes a third coating layer 531 and a fourth coating layer 532 formed on top and bottom surfaces of the circuit member 510, respectively. Since the third coating layer 531 is formed at only a bent portion where the circuit member 510 is bent, a bent state of the circuit member 510 is maintained, and the fourth coating layer 532 is coated on only a portion other than the bent portion on the bottom surface of the circuit member 510.

The fourth coating layer 532 maintains the unbent portion of the circuit member 510 at a planar state, while the third coating layer 531 maintains the bent portion of the circuit member 510 at a bent state.

Alternatively, the fourth coating layer 532 may be formed at only a bent portion on the bottom surface of the circuit member 510, while the third coating layer 531 may be coated on only a portion other than the bent portion on the top surface of the circuit member 510.

Figure 9:
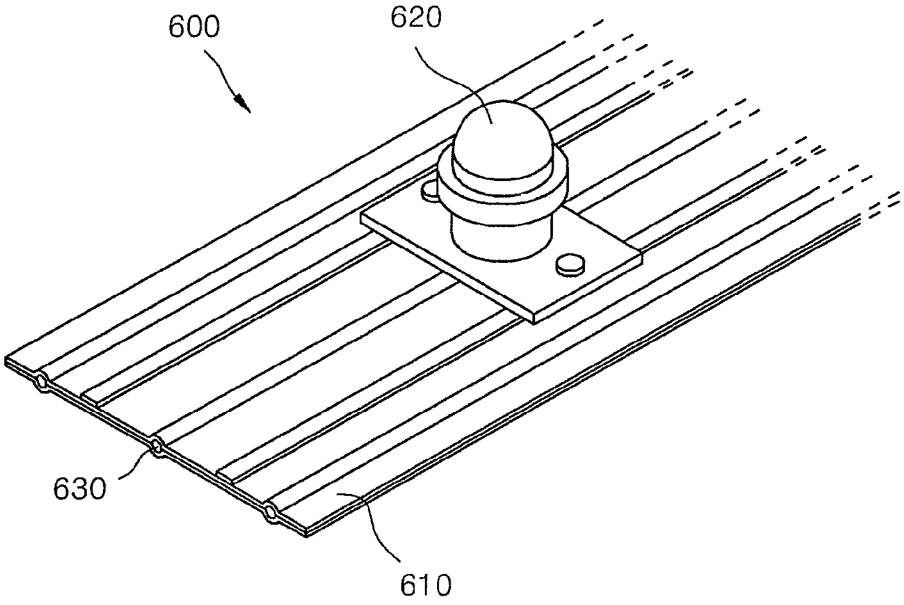
FIG. 9 is a perspective view of a lamp unit according to a sixth embodiment of the present invention.

FIG. 9 is a perspective view of a lamp unit according to a sixth embodiment of the present invention.

As shown in FIG. 9, the lamp unit 600 according to the sixth embodiment of the present invention includes a shape fixing member 630 incorporated into a circuit member 610.

The circuit member 610 is formed of a flexible synthetic resin member. Like in the previous embodiments, a conductive pattern 412 is printed to be electrically conducted to apply current to an LED lamp 620 when the LED lamp 620 is installed.

The shape fixing member 630 is inserted into the circuit member 610 and extends in parallel with a lengthwise direction of the circuit member 610. When the circuit member 610 is bent by a predetermined angle by a fixing force of the shape fixing member 630 incorporated into the circuit member 610, a bent shape of the circuit member 610 can be maintained.

In this embodiment, the shape fixing member 630 incorporated into the circuit member 610 is formed in the form of a wire having a predetermined diameter, and three shape fixing members are inserted into the circuit member 610 to be spaced apart from each other. Alternatively, the shape fixing member 630 may also be formed as a thin film, and the incorporated shape fixing member 630 may be formed to have various widths or thicknesses.

Figure 10:
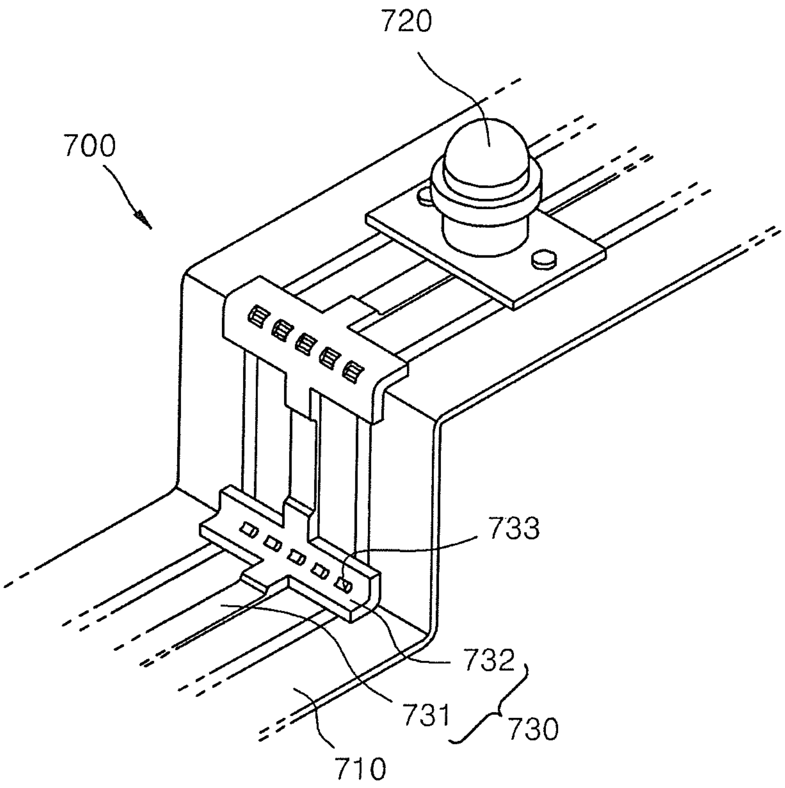
FIG. 10 is a perspective view of a lamp unit according to a seventh embodiment of the present invention.

FIG. 10 is a perspective view of a lamp unit according to a seventh embodiment of the present invention.

Referring to FIG. 10, in the lamp unit 700 according to the seventh embodiment of the present invention, a shape fixing member 730 for maintaining a circuit member 710 at a bent state includes a thin film part 731 for maintaining the bent state, and a shape maintaining part 732 for maintaining a bent shape of the circuit member 710.

The thin film part 731 maintains a planar shape of the circuit member 710 at a portion where the circuit member 710 is not bent, while the shape maintaining part 732 is formed at the bent portion of the circuit member 710 and maintains a bent shape of the circuit member 710.

In order to maintain the bent shape of the circuit member 710, a larger shape fixing force is required at the shape maintaining part 732 than at the thin film part 731. Thus, a thickness of the shape maintaining part 732 is greater than that of the thin film part 731, and a width of the shape maintaining part 732 is enlarged in a direction crossing a lengthwise direction of the circuit member 710.

In addition, the shape maintaining part 732 includes guide grooves 733 to easily achieve bending of the circuit member 710 at the bent portion.

As described above, the lamp units according to the embodiments of the present invention are bendable and bent shapes thereof can be easily maintained. Therefore, the lamp units according to the present invention can be easily applied to a variety of types of objects on which the lamp unit is to be installed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. All related/conventional art references described above are hereby incorporated in their entirety by reference.

The present invention can be applied to a field of LED-type lamp units requiring various curved shapes, such as vehicular tail lamps, in various manners.

What is claimed is:

1. A lamp unit comprising:

a flexible base member;

a conductive pattern layer forming a conductive pattern the base member and maintaining a bent shape of the base member when the base member is bent;

LED lamps mounted on the conductive pattern layer and emitting light when a current is applied thereto; and wherein the conductive pattern layer includes a first section extending along a lengthwise direction of the base member, and a second section formed at the bent portion of the base member and having a greater thickness than the first section so as to maintain the bent shape of the base member.

2. A lamp unit comprising:

a flexible base member;

a conductive pattern layer forming a conductive pattern the base member and maintaining a bent shape of the base member when the base member is bent;

LED lamps mounted on the conductive pattern layer and emitting light when a current is applied thereto; and wherein the conductive pattern layer includes an elongate section extending along a lengthwise direction of the base member, and an enlarged section installed at the bent portion of the base member and formed to have a larger width than the elongate section so as to maintain the bent shape of the base member.

3. The lamp unit of claim 2, wherein the enlarged section includes a plurality of guide grooves extending to be spaced a predetermined distance apart from each other along a direction crossing the lengthwise direction of the base member so as to allow the base member to be easily bent, the plurality of guide grooves being recessed a predetermined depth from a top surface of the enlarged section.

4. A lamp unit comprising:

a circuit member including a flexible base plate and a conductive pattern formed at one side of the base plate;

a shape fixing member installed at the circuit member and maintaining a bent shape when the circuit member is bent; and LED lamps mounted on the circuit member and emitting light when a current is applied thereto through the conductive pattern, wherein the shape fixing member includes a metal layer coated on one selected from top and bottom surfaces of the circuit member or both of the top and bottom surfaces of the circuit member, the metal layer made of at least one selected from copper, silver, gold and aluminum, or alloys of two or more of these metals, and wherein the shape fixing member includes a thin film part coated on a planar part of the circuit member, which is not bent, and a shape maintaining part coated on the bent portion of the circuit member and having a thickness greater than that of the thin film part so as to easily maintain the bent shape of the circuit member.

* * * * *